(12) United States Patent
Orui et al.

(10) Patent No.: US 10,188,009 B2
(45) Date of Patent: Jan. 22, 2019

(54) CONNECTOR DEVICE

(71) Applicant: FUJITSU LIMITED, Kawasaki-shi, Kanagawa (JP)

(72) Inventors: Kazuya Orui, Kawasaki (JP); Koki Takahashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/968,793

(22) Filed: May 2, 2018

(65) Prior Publication Data
US 2018/0332725 A1 Nov. 15, 2018

(30) Foreign Application Priority Data
May 12, 2017 (JP) ................. 2017-095662

(51) Int. Cl.
*H01R 24/00* (2011.01)
*H05K 5/02* (2006.01)

(52) U.S. Cl.
CPC ......... *H05K 5/0295* (2013.01); *H05K 5/0291* (2013.01)

(58) Field of Classification Search
CPC .. H05K 5/0295; H05K 5/0291; H01R 13/629; H01R 13/6373
See application file for complete search history.

(56) References Cited

U.S. PATENT DOCUMENTS

| | | | | |
|---|---|---|---|---|
| 2008/0282271 A1* | 11/2008 | Morita | ............... | G11B 17/0284 720/603 |
| 2010/0235849 A1* | 9/2010 | Hanafusa | ........... | G11B 17/0436 720/601 |
| 2012/0030693 A1* | 2/2012 | Mihara | .................. | G06F 1/1613 720/601 |
| 2013/0273760 A1* | 10/2013 | Narita | .................. | H01R 13/629 439/153 |
| 2015/0096867 A1* | 4/2015 | Schiavina | ............... | B65G 43/08 198/418 |
| 2016/0294114 A1* | 10/2016 | Nonen | ............... | H01R 13/6273 |
| 2017/0260489 A1* | 9/2017 | Koseki | ................... | C12M 23/04 |

FOREIGN PATENT DOCUMENTS

| | | |
|---|---|---|
| JP | 2005-005176 | 1/2005 |
| JP | 2016-076379 | 5/2016 |

* cited by examiner

*Primary Examiner* — Jean F Duverne
(74) *Attorney, Agent, or Firm* — Fujitsu Patent Center

(57) ABSTRACT

A connector device includes a body having an opening on one end in a first direction, the body including inside a first space, and a second space positioned closer to the opening than the first space in the first direction and arranged in line with the first space in the first direction, a first tray that holds a first medium, a first sliding assembly that inserts and removes the first tray in the first direction with respect to the first space via the opening, and a second sliding assembly that inserts and removes a second medium different from the first medium in the first direction with respect to the second space via the opening, wherein out of the first tray and the second medium, only the second medium is removed in a state in which the first tray and the second medium are inserted into the body.

9 Claims, 16 Drawing Sheets

CONNECTOR DEVICE

CROSS-REFERENCE TO RELATED APPLICATION(S)

This application is based upon and claims the benefit of priority of the prior Japanese Patent Application No. 2017-95662, filed on May 12, 2017, the entire contents of which are incorporated herein by reference.

FIELD

The embodiments discussed herein are related to a connector device.

BACKGROUND

A connector device to and from which two media (for example, a subscriber identity module (SIM) card and a memory card) may be individually inserted and removed is known.

However, with the above-described conventional technique, it is difficult to reduce the size in the thickness direction of the connector device (thickness direction of the media). The connector device may be mounted on an electronic device, and the size of the connector device in the thickness direction may be a limitation with respect to thinning of the electronic device.

The following is a reference document.
[Document 1] Japanese Laid-open Patent Publication No. 2005-5176.

SUMMARY

According to an aspect of the invention, a connector device includes a body having an opening on one end in a first direction, the body including inside a first space, and a second space positioned closer to the opening than the first space in the first direction and arranged in line with the first space in the first direction, a first tray that holds a first medium, a first sliding assembly that inserts and removes the first tray in the first direction with respect to the first space via the opening, and a second sliding assembly that inserts and removes a second medium different from the first medium in the first direction with respect to the second space via the opening, wherein out of the first tray and the second medium, only the second medium is removed in a state in which the first tray and the second medium are inserted into the body.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, each of embodiments will be described in detail with reference to the drawings.

First Embodiment

Figure 1:
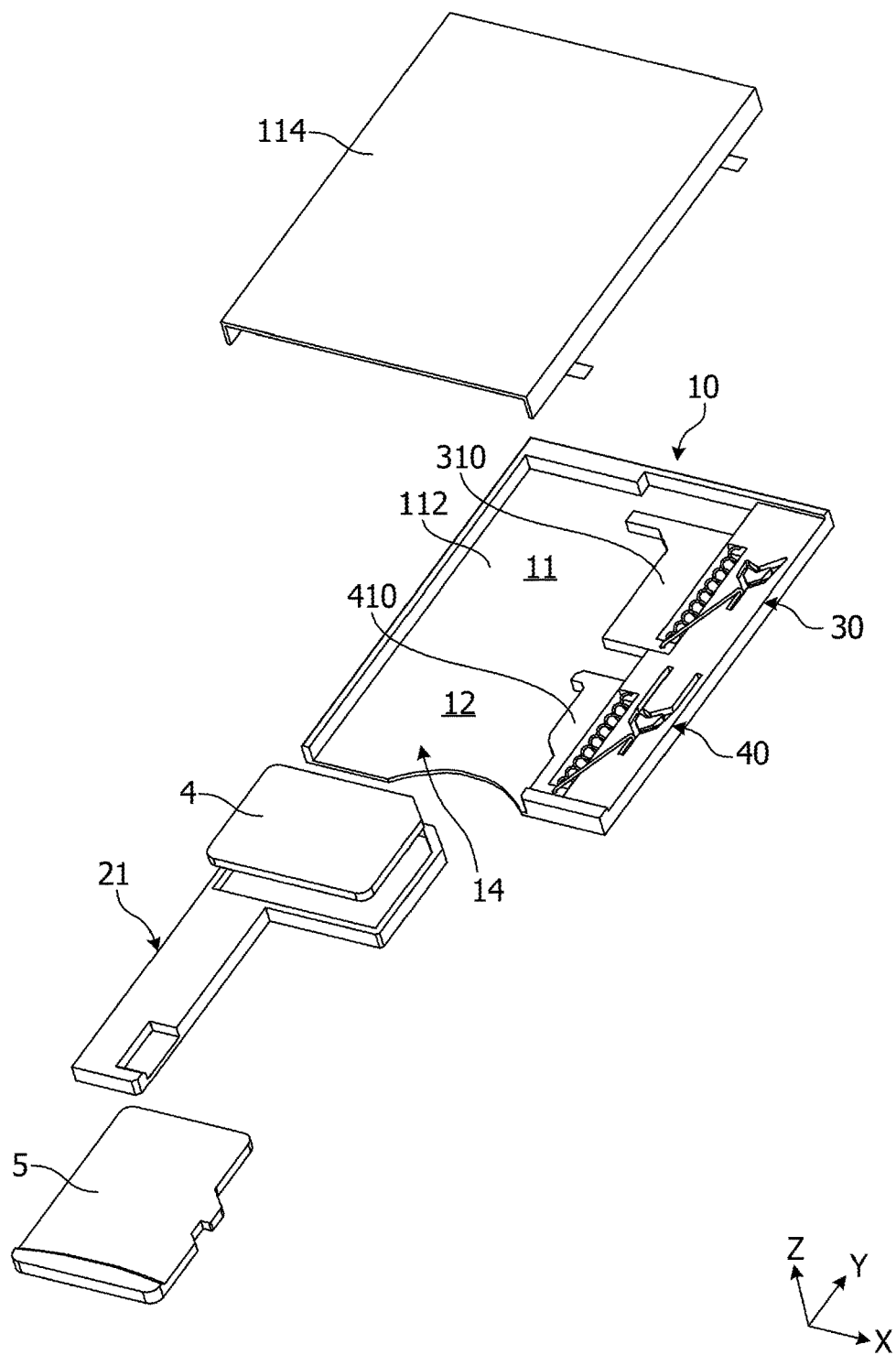
FIG. 1 is an exploded perspective view of a connector device according to a first embodiment.

FIG. 1 is an exploded perspective view of a connector device 1 according to a first embodiment.

In FIG. 1, an X axis, a Y axis, and a Z axis, which are three axes orthogonal to one another, are illustrated. A Y direction (an example of a first direction) corresponds to an insertion and removal direction. In the description below, for the sake of explanation, a positive side of the Y direction is defined as a "deep side", and a negative side of the Y direction is defined as a "front side". Furthermore, for the sake of explanation, a positive side of a Z direction is defined as an "upper side", and a negative side of the Z direction is defined as a "lower side". However, a direction of the connector device 1 in a mounted state is optional.

The connector device 1 is what is called a combo-connector, in which a plurality of types of connectors are combined and integrated with one another, and is mounted on an electronic device. The electronic device typically is a communication terminal, for example, a smartphone, a mobile phone, a tablet terminal, a desktop type personal computer (PC), a notebook type PC, and the like. In the description below, the connector device 1 is to be mounted on a communication terminal, as an example.

The connector device 1 includes a body 10, a SIM tray 21 (an example of a first tray), a first mechanism 30, and a second mechanism 40.

The body 10 is a part fixed to the electronic device to which the connector device 1 is mounted and forms a case of the connector device 1. A case part of the body 10 may be formed by bonding a shell part 114 on the upper side that is formed of a thin plate metal material and a base part 112 on the lower part, for example. The body 10 may be formed of three or more members. For example, the body 10 includes a part on which a first cam groove 340 and the like, which will be described later, are formed integrally with the case part. It is to be noted that the part on which the first cam groove 340 and the like are formed may be formed integrally with the case part and may be formed separately from the case part to be bonded with the case part (for example, the base part 112).

The base part 112 of the body 10 is fixed to a substrate (not illustrated) of the communication terminal. On the substrate, a circuit part (not illustrated) is formed to be electrically connected to a SIM card 4, which will be described later, when the SIM card 4 is in a lock state within the body 10. Furthermore, on the substrate, a circuit part (not illustrated) is formed to be electrically connected to an SD memory card 5, which will be described later, when the SD memory card 5 is in the lock state within the body 10. The communication terminal is capable of operating based on information within the SIM card 4 and information within the SD memory card 5.

The body 10 forms a first space 11 and a second space 12 which are arranged in line with each other in the Y direction within the connector device 1. In the first space 11, the SIM tray 21 is insertable and removable in the Y direction. In the second space 12, the SD memory card 5 is insertable and removable in the Y direction. The first space 11 is formed on a deeper side than the second space 12.

The body 10 is opened on the front side and closed on the deep side. That is to say, the body 10 has an opening 14 on the front side. Accordingly, the first space 11 is closed on the deep side thereof and communicates with the outside of the body 10 via the second space 12 on the front side thereof. Furthermore, the second space 12 is adjacent to the first space 11 on the deep side thereof and communicates with the outside of the body 10 on the front side thereof.

The SIM tray 21 is a tray capable of holding the SIM card 4 (an example of a first medium). The SIM card 4 is an integrated circuit (IC) card in which an identification (ID) number for identifying a valid user of the communication terminal is recorded. In the first embodiment, as an example, the SIM card 4 has the form of nano-SIM as illustrated in FIG. 1, but may have an optional form such as the form of micro-SIM.

The first mechanism 30 has a configuration in which the SIM tray 21 is insertable and removable in the Y direction with respect to the first space 11 of the body 10. The first mechanism 30 has a configuration in which the SIM tray 21 is insertable and removable via the opening 14 of the body 10. The details of the first mechanism 30 will be described later.

The second mechanism 40 has a configuration in which the SD memory card 5 (an example of a second medium) is insertable and removable in the Y direction with respect to the second space 12 of the body 10. The second mechanism 40 has a configuration in which the SIM tray 21 is insertable and removable via the opening 14 of the body 10. The SD memory card 5 is an example of a memory card. Instead of the SD memory card 5, other type of memory card may be applied. In the example illustrated in FIG. 1, the SD memory card 5 has the form of micro SD card, but may have other form (for example, the form of mini SD card or the form of normal SD card).

The second mechanism 40 is a mechanism separate from the first mechanism 30. The second mechanism 40 enables to remove only the SD memory card 5 when the SD memory card 5 and the SIM tray 21 are in the lock state (both-locked state described later). That is to say, the second mechanism 40 enables to remove the SD memory card 5 in a manner in which removal of the SD memory card 5 is not accompanied by removal of the SIM tray 21 (and removal of the SIM card 4, accordingly). The details of the second mechanism 40 will be described later.

As described above, according to the first embodiment, out of the first space 11 and the second space 12 which are arranged in line with each other in the Y direction, with respect to the first space 11, the SIM tray 21 is insertable and removable with the first mechanism 30, and with respect to the second space 12, the SD memory card 5 is insertable and removable with the second mechanism 40. At this time, the user is able to remove only the SD memory card 5 and thereby able to avoid an inconvenience caused by insertion and removal of the SIM tray that possibly occurs accompanied by insertion and removal of the SD memory card. Specifically, in a configuration in which removal of the SIM tray is accompanied by removal of the SD memory card, the power supply of the communication terminal has to be turned off even when only the SD memory card is desired to be exchanged. This is because the power supply of the communication terminal has to be turned off when the SIM card is removed. In this respect, according to the first embodiment, when only the SD memory card 5 is desired to be removed, the power supply of the communication terminal does not have to be turned off, whereby convenience of the user is improved.

It is to be noted that in the first embodiment, while the SD memory card 5 is able to be removed alone, the SIM tray 21 is not able to be removed alone. In this respect, when the SIM tray 21 is removed, the power supply of the communication terminal has to be turned off, and thus, no significant inconvenience is caused by removal of the SD memory card 5 accompanied by removal of the SIM tray 21.

Furthermore, using the first space 11 and the second space 12 which are arranged in line with each other in the Y direction enables to enhance thinning of the connector device 1 in the thickness direction (up and down direction). In other words, the present embodiment does not enable to insert and remove each of the SIM tray 21 and the SD memory card 5 individually, but enables to insert and remove only the SD memory card 5 individually. This configuration enables to use the first space 11 and the second space 12 which are arranged in line with each other in the Y direction and enhance thinning of the connector device 1 in the thickness direction.

Next, with reference to FIGS. 2A and 2B, the details of the first mechanism 30 and the second mechanism 40 will be described.

The first mechanism 30 and the second mechanism 40 enables both of removal of both the SIM tray 21 and the SD memory card 5 and removal of only the SD memory card 5 selectively, as described below. In the description below, a function to enable removal of both of the SIM tray 21 and the SD memory card 5 is referred to as a "simultaneous removal function" and a function to enable removal of only the SD memory card 5 is referred to as an "SD single removal function". Furthermore, a function to enable to implement both of the simultaneous removal function and the SD single removal function selectively is referred to as a "simultaneous removal/SD single removal function".

Figure 2A:
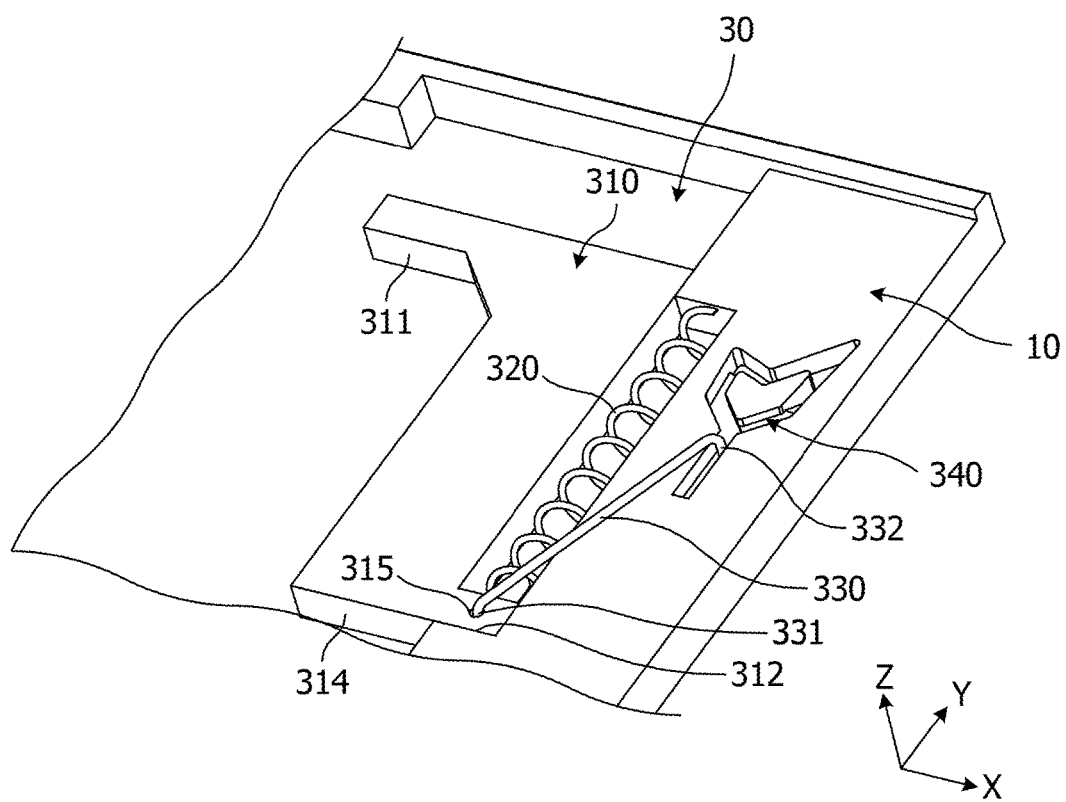
FIG. 2A is an enlarged view of a first mechanism in FIG. 1.

FIG. 2A is an enlarged view of the first mechanism 30 in FIG. 1.

The first mechanism 30 includes a first slide member 310, a first elastic member 320, a first cam pin 330, and a first cam groove 340, as illustrated in FIG. 2A.

The first slide member 310 is displaceable with respect to the body 10 in the Y direction. The first slide member 310 is provided inside the body 10 and the displacement of the first slide member 310 in the up and down direction is constrained by the body 10.

The first slide member 310 has a tray locking part 311 that abuts the end on the deep side of the SIM tray 21 from the deep side in the Y direction. In a state in which the SIM tray 21 abuts the tray locking part 311, the user is able to press the first slide member 310 to the deep side by pressing the SIM tray 21 to the deep side.

The first slide member 310 has a front side stopper part 312 that abuts the body 10 from the deep side in the Y direction. When the front side stopper part 312 abuts the body 10 in the Y direction (see FIG. 9), further displacement of the first slide member 310 with respect to the body 10 to the front side is constrained. With this, the position on which the front side stopper part 312 abuts the body 10 in the Y direction becomes the boundary position on the front side in a movable range of the first slide member 310.

The first slide member 310 has a slide abutting part 314 that abuts a second slide member 410 from the deep side in the Y direction, which will be described later. In a state in which the second slide member 410 abuts the slide abutting part 314 (see FIG. 4), the first slide member 310 is able to displace to the deep side integrally with the second slide member 410. It is to be noted that although the slide abutting part 314 is formed on the same plane as the front side stopper part 312 in the example illustrated in FIG. 2A, the slide abutting part 314 may be offset in the Y direction with respect to the front side stopper part 312.

The first elastic member 320 biases the first slide member 310 to the front side (the negative side in the Y direction and the removal direction of the SIM tray 21). In the first embodiment, as an example, the first elastic member 320 has the form of a spring extending in the Y direction. The end on the deep side of the first elastic member 320 is supported by the body 10 and the end on the front side of the first elastic member 320 is supported by the first slide member 310. When the first slide member 310 is displaced to the deep side, the first elastic member 320 is compressed and thereby enhances a biasing force that biases the first slide member 310 to the front side.

The first cam pin 330 and the first cam groove 340 forms a heart-cam mechanism (hereinafter, also referred to as a "first heart-cam mechanism"). The heart-cam mechanism formed by the first cam pin 330 and the first cam groove 340 cooperates with the first slide member 310 and the body 10 to define the movement of the SIM tray 21 in the Y direction.

One end 331 of the first cam pin 330 is supported by the first slide member 310 and the other end 332 of the first cam pin 330 is fit into the first cam groove 340, as illustrated in FIG. 2A. For example, the one end 331 of the first cam pin 330 is supported by a pin hole 315 formed on the first slide member 310 so as to be rotated around the Z axis, and serves as a rotation supporting point. The displacement of the first cam pin 330 in the up and down direction is constrained by the body 10 and the first slide member 310. With this, the movement of the first cam pin 330 is defined by rotation of the one end 331 around the Z axis on the side of the first slide member 310 and the displacement of the other end 332 in the first cam groove 340.

The first cam groove 340 is provided on the body 10, as illustrated in FIG. 2A. The first cam groove 340 defines the movement of the other end 332 of the first cam pin 330, as described above. In other words, the first cam groove 340 defines the locus on which the other end 332 of the first cam pin 330 travels (hereinafter, also referred to as a "first locus"). The details of the shape of the first cam groove 340 (details of the first locus) will be described later together with the details of the shape of a second cam groove 440.

Figure 2B:
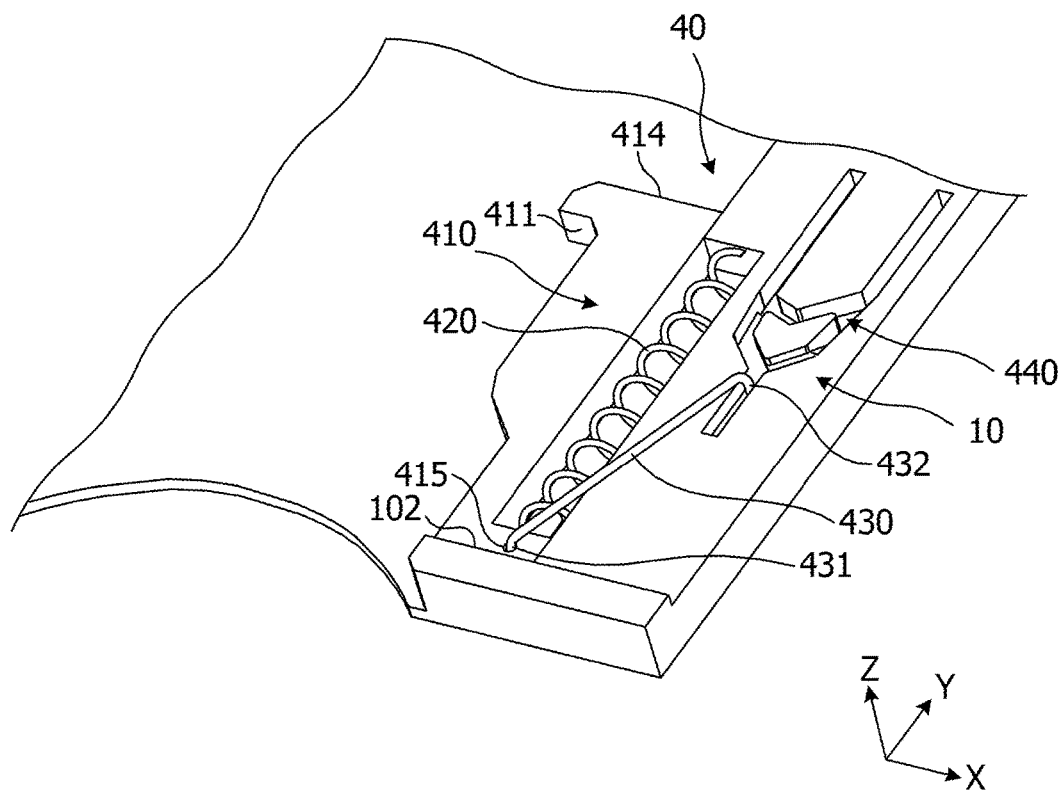
FIG. 2B is an enlarged view of a second mechanism in FIG. 1.

FIG. 2B is an enlarged view of the second mechanism 40 in FIG. 1.

The second mechanism 40 includes the second slide member 410, a second elastic member 420, a second cam pin 430, and the second cam groove 440, as illustrated in FIG. 2B.

The second slide member 410 is displaceable with respect to the body 10 in the Y direction. The second slide member 410 is provided inside the body 10 and the displacement of the second slide member 410 in the up and down direction is constrained by the body 10. The second slide member 410 is provided in a manner adjacent to the first slide member 310 from the front side in the Y direction.

The second slide member 410 has a card locking part 411 that abuts the end on the deep side of the SD memory card 5 from the deep side in the Y direction. In a state in which the SD memory card 5 abuts the card locking part 411, the user is able to press the second slide member 410 to the deep side by pressing the SD memory card 5 to the deep side.

The second slide member 410 has a front side stopper part 412 (see FIG. 5) that abuts the front side end 102 of the body 10 from the deep side in the Y direction. When the front side stopper part 412 abuts the body 10 in the Y direction (see FIG. 7), further displacement of the second slide member 410 with respect to the body 10 to the front side is constrained. With this, the position on which the front side stopper part 412 abuts the body 10 in the Y direction becomes the boundary position on the front side in a movable range of the second slide member 410.

The second slide member 410 has a slide abutting part 414 that abuts the slide abutting part 314 (see FIG. 2A) of the first slide member 310 from the front side in the Y direction. As described above, in a state in which the first slide member 310 abuts the slide abutting part 414 (see FIG. 4), the first slide member 310 is able to displace to the deep side integrally with the second slide member 410.

The second elastic member 420 biases the second slide member 410 to the front side (the negative side in the Y direction and the removal direction of the SD memory card 5). It is to be noted that the removal direction of the SD memory card 5 is the same as the removal direction of the SIM tray 21. In the first embodiment, as an example, the second elastic member 420 has the form of a spring extending in the Y direction. The end on the deep side of the second elastic member 420 is supported by the body 10 and the end on the front side of the second elastic member 420 is supported by the second slide member 410. When the second slide member 410 is displaced to the deep side, the second elastic member 420 is compressed and thereby enhances a biasing force that biases the second slide member 410 to the front side.

The second cam pin 430 and the second cam groove 440 forms a heart-cam mechanism (hereinafter, also referred to as a "second heart-cam mechanism"). The heart-cam mechanism formed by the second cam pin 430 and the second cam groove 440 cooperates with the second slide member 410 and the body 10 to define the movement of the SD memory card 5 in the Y direction.

One end 431 of the second cam pin 430 is supported by the second slide member 410 and the other end 432 of the second cam pin 430 is fit into the second cam groove 440, as illustrated in FIG. 2B. For example, the one end 431 of the second cam pin 430 is supported by a pin hole 415 formed on the second slide member 410 so as to be rotated around the Z axis, and serves as a rotation supporting point.

The displacement of the second cam pin 430 in the up and down direction is constrained by the body 10 and the second slide member 410. With this, the movement of the second cam pin 430 is defined by rotation of the one end 431 around the Z axis on the side of the second slide member 410 and the displacement of the other end 432 in the second cam groove 440.

The second cam groove 440 is provided on the body 10, as illustrated in FIG. 2B. The second cam groove 440 defines the movement of the other end 432 of the second cam pin 430, as described above. In other words, the second cam groove 440 defines the locus on which the other end 432 of the second cam pin 430 travels (hereinafter, also referred to as a "second locus").

Next, with reference to FIGS. 3A and 3B and FIGS. 4 to 9, the details of the first cam groove 340 (the first locus) and the second cam groove 440 (the second locus) will be described.

Figure 3A:
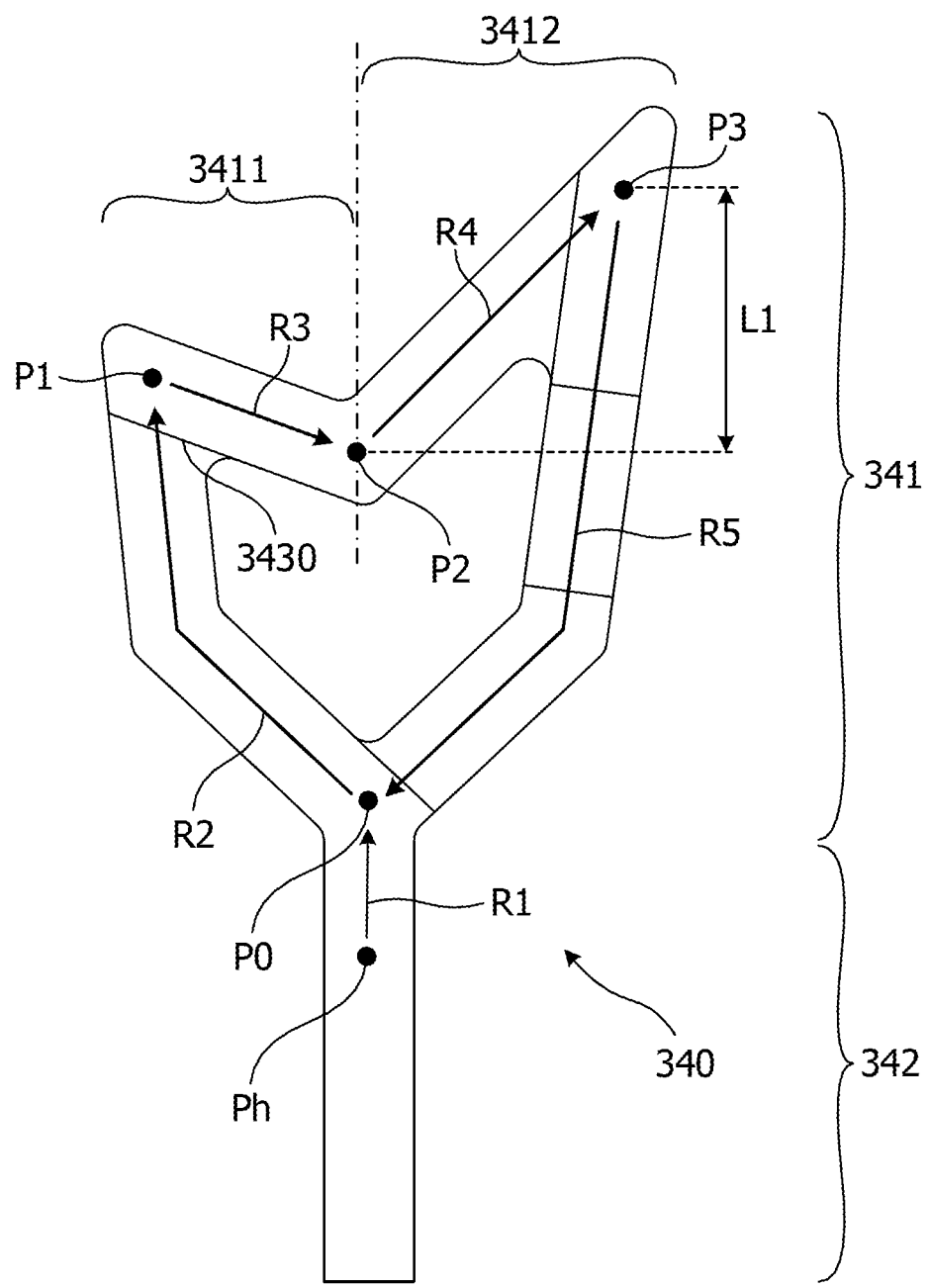
FIG. 3A is a diagram illustrating a first cam groove by a top view (view in a Z direction)
Figure 3B:
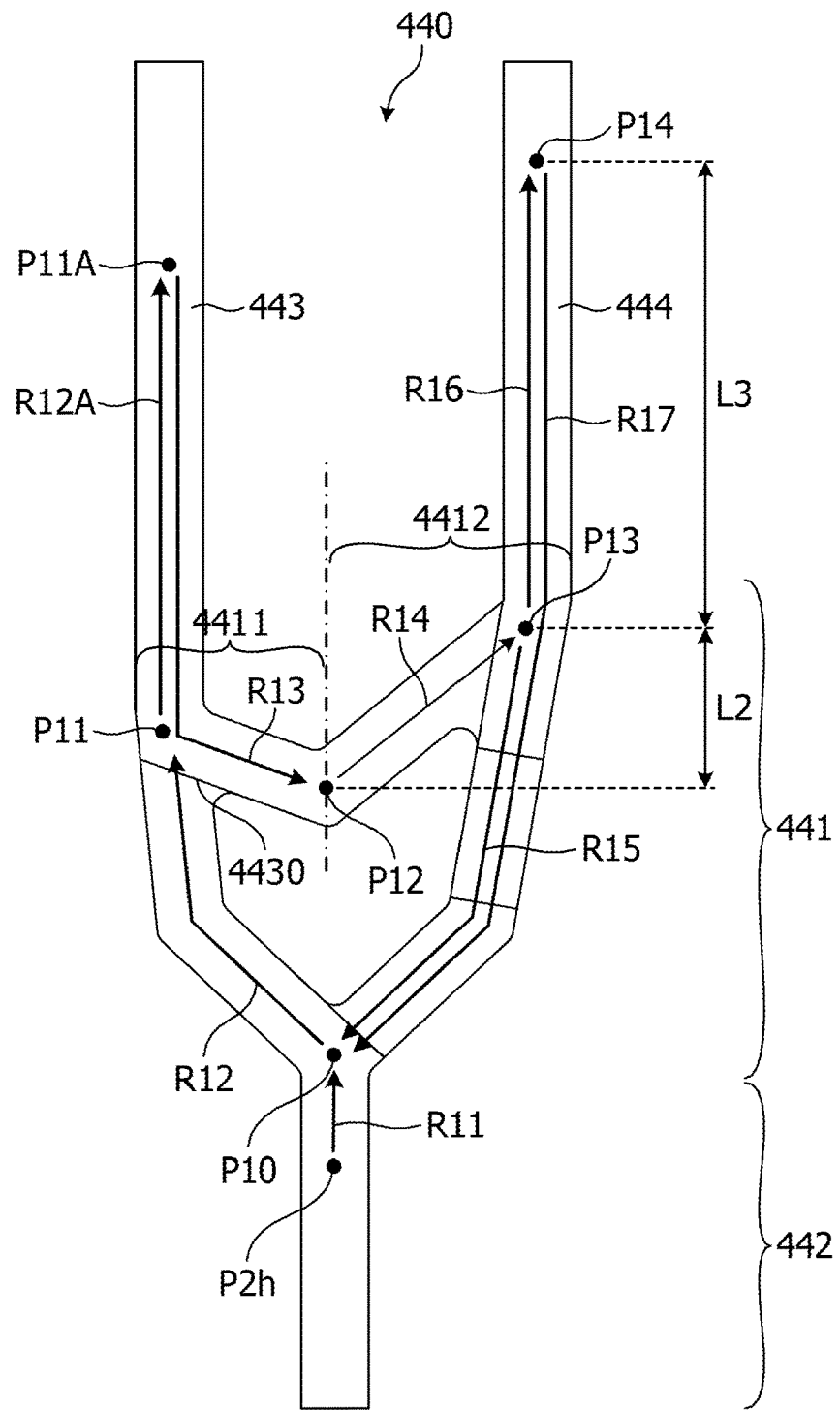
FIG. 3B is a diagram illustrating a second cam groove by a top view.

FIG. 3A is a diagram schematically illustrating the first cam groove 340 by a top view (view in a Z direction). FIG. 3B is a diagram schematically illustrating the second cam groove 440 by a top view.

Figure 4:
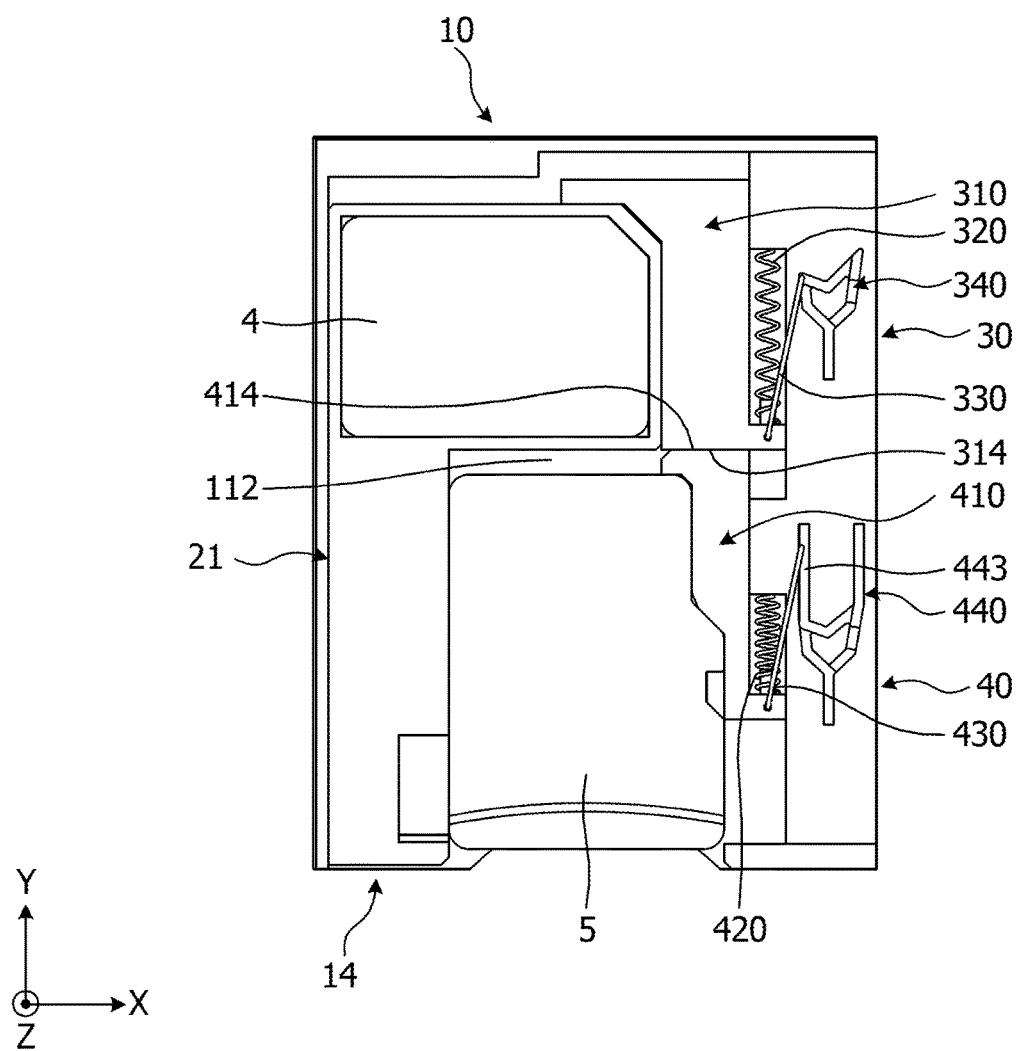
FIG. 4 is a diagram illustrating an insertion process into a both-locked state.
Figure 5:
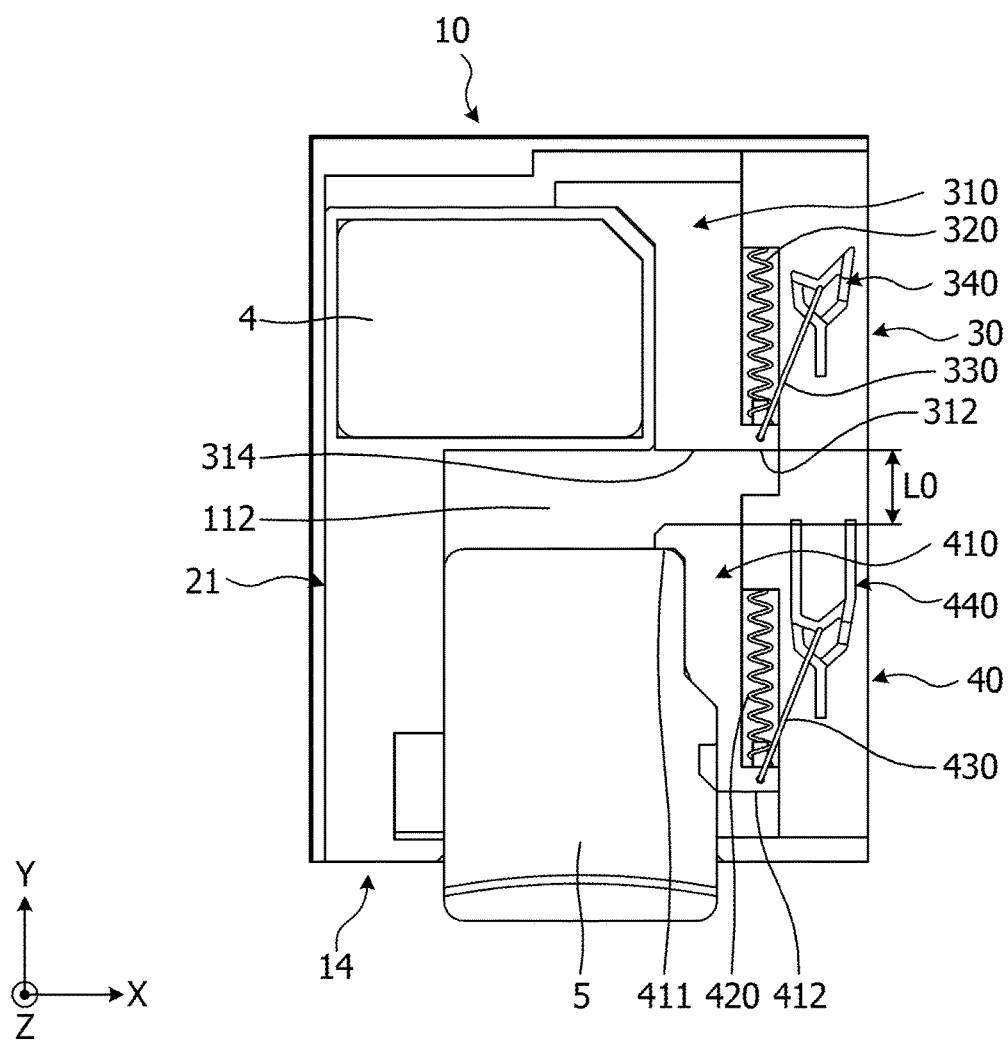
FIG. 5 is a diagram illustrating the both-locked state.
Figure 6:
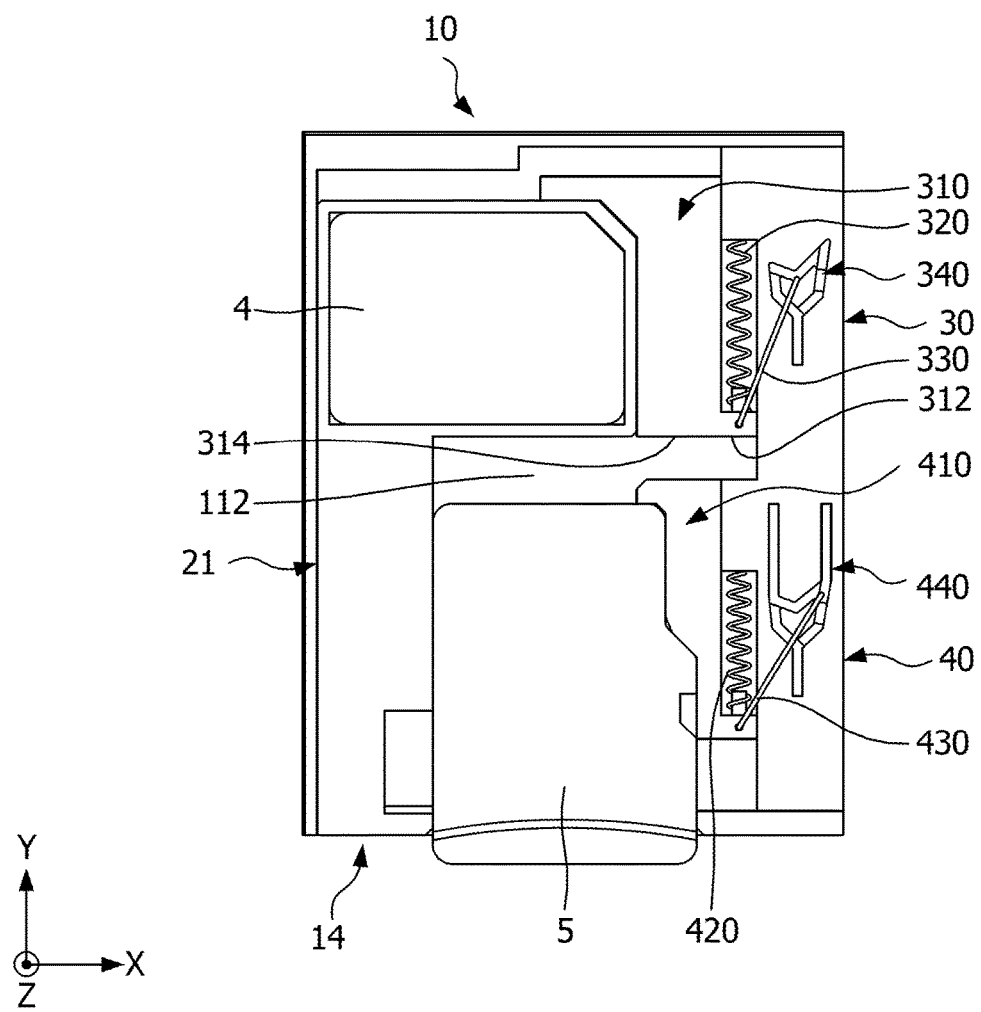
FIG. 6 is a diagram illustrating a state in which only an SD memory card is being removed from the both-locked state.
Figure 7:
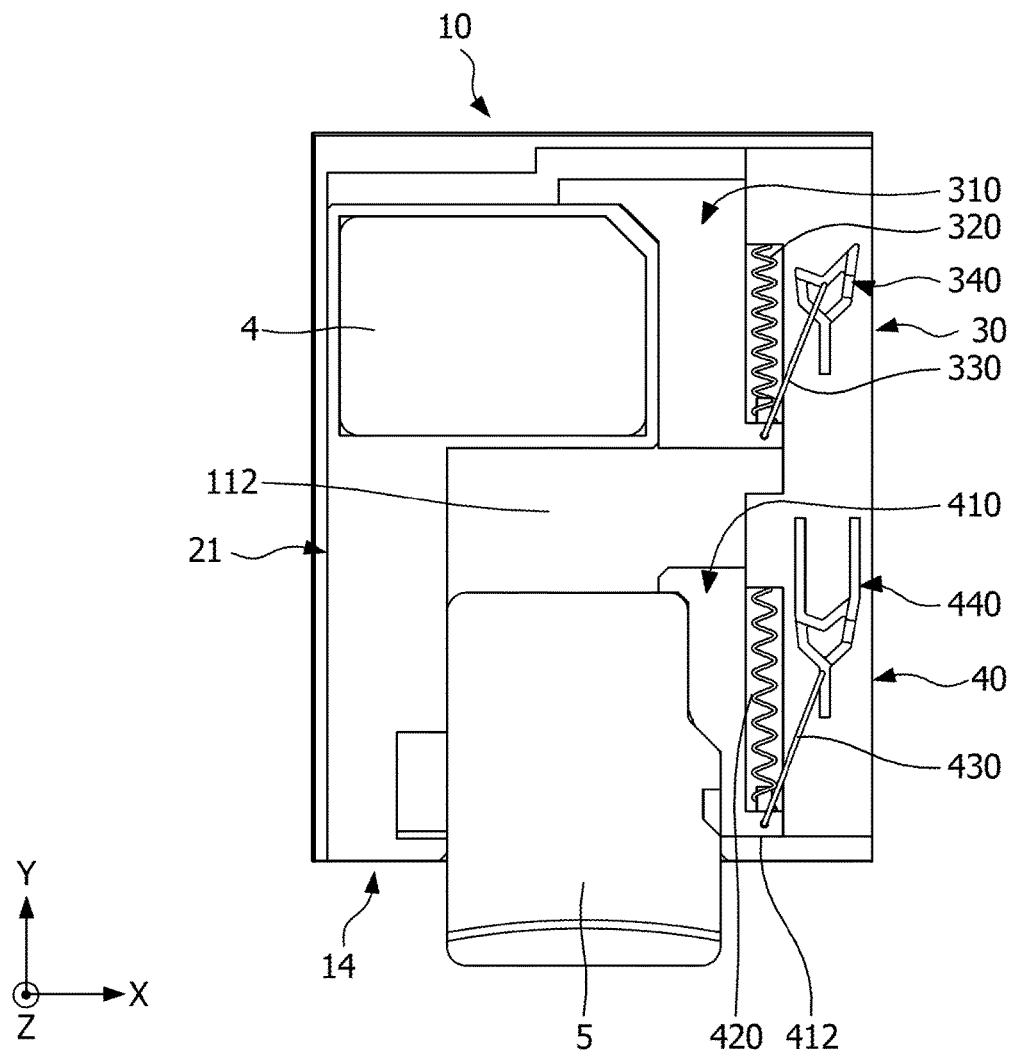
FIG. 7 is a diagram illustrating a state in which only the SD memory card is removable.
Figure 8:
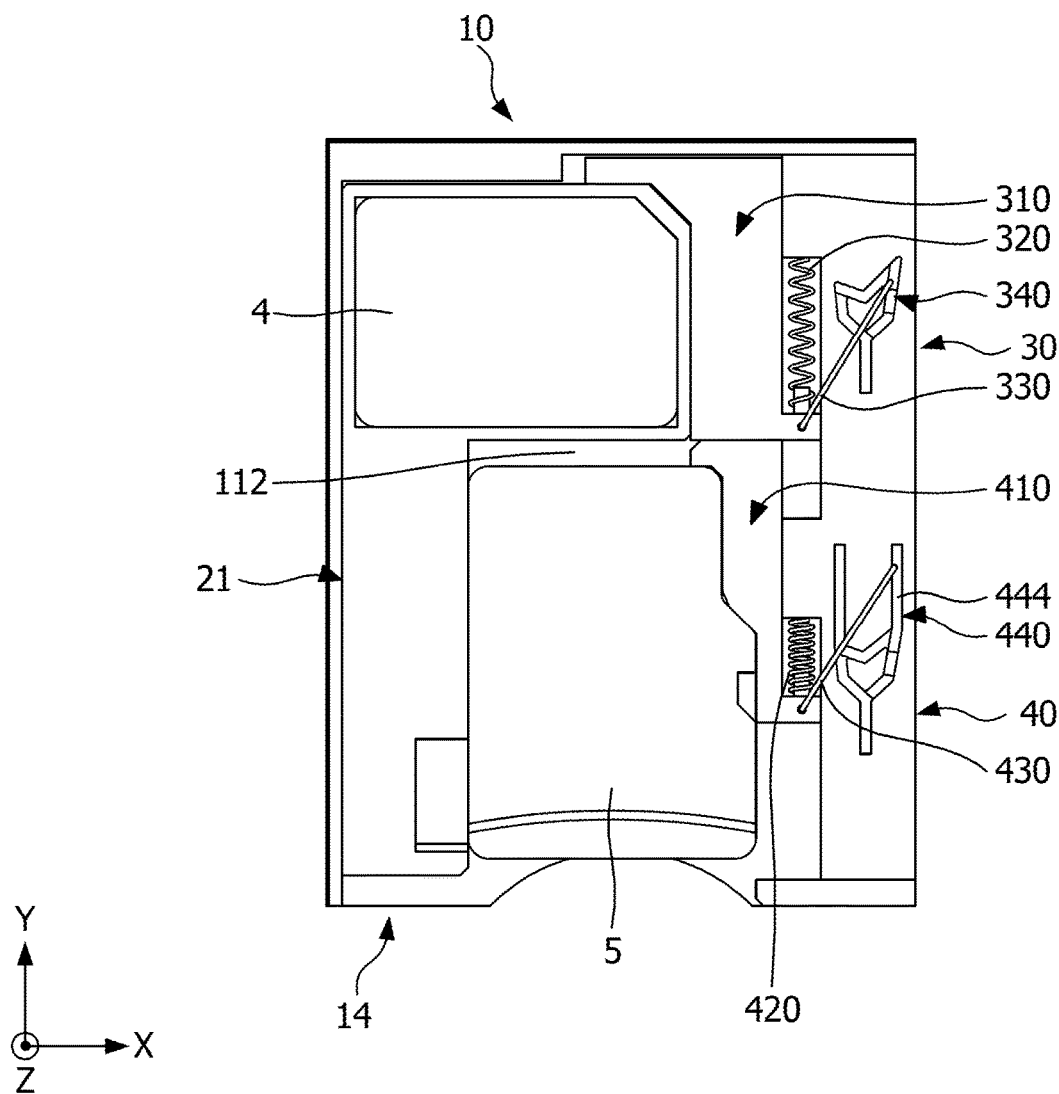
FIG. 8 is a diagram illustrating a state in which the SD memory card and a SIM tray are being removed from the both-locked state.
Figure 9:
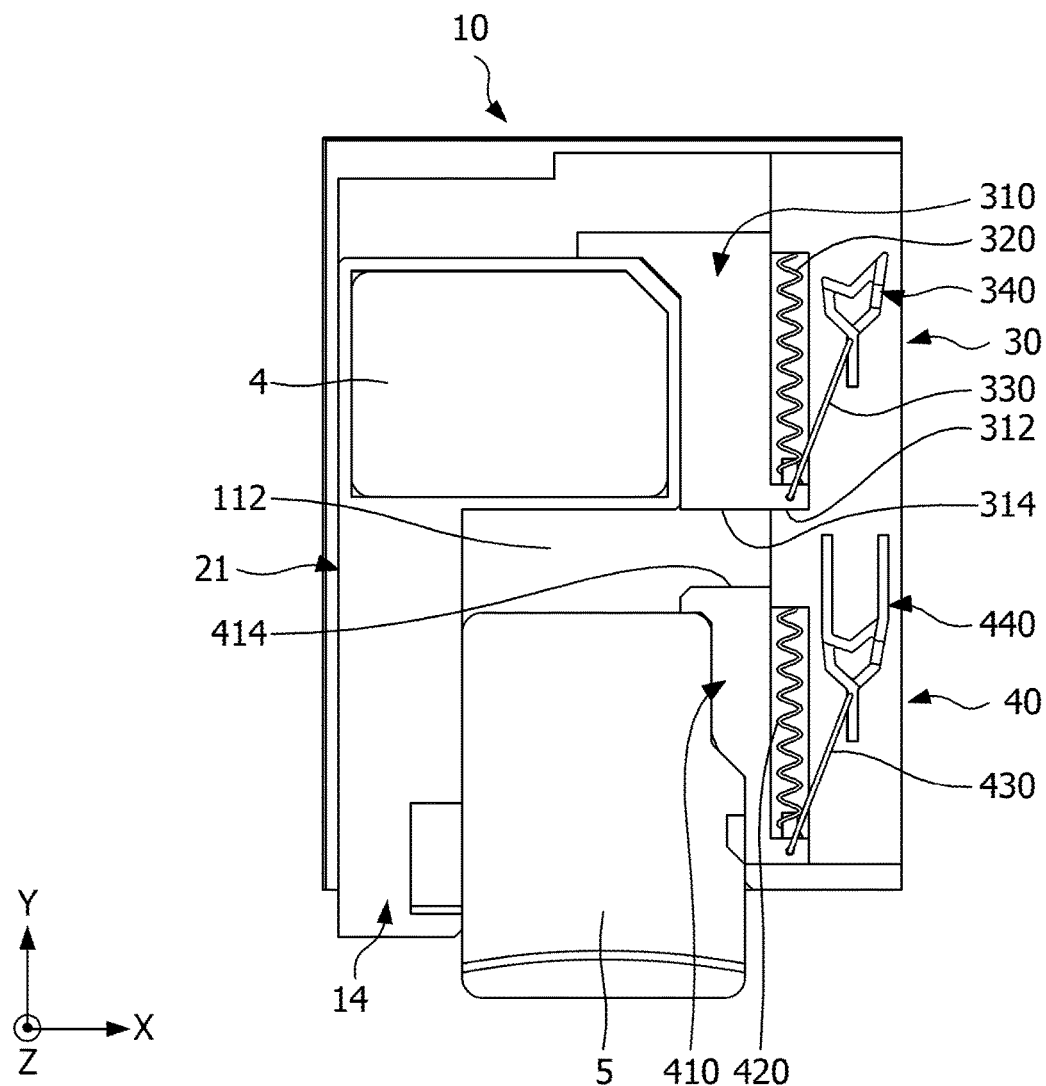
FIG. 9 is a diagram illustrating a state in which the SD memory card and the SIM tray are removable.

FIGS. 4 to 9 are top views illustrating the inside of the connector device 1 in various states. In FIGS. 4 to 9, illustration of the shell part 114 on the upper side of the connector device 1 is omitted so as to clarify the inside. FIG. 4 illustrates an insertion process into a lock state of the SD memory card 5 and the SIM tray 21 (and the SIM card 4, accordingly). FIG. 5 illustrates the lock state of the SD memory card 5 and the SIM tray 21 (a state in which insertion of the SD memory card 5 and the SIM tray 21 have been completed, and hereinafter, also referred to as a "both-locked state"). FIG. 6 illustrates a state in which only the SD memory card 5 is being removed. FIG. 7 illustrates a state in which only the SD memory card 5 is removable. FIG. 8 illustrates a state in which the SD memory card 5 and the SIM tray 21 (and the SIM card 4, accordingly) are being removed. FIG. 9 illustrates a state in which the SD memory card 5 and the SIM tray 21 are removable.

The first locus defined by the first cam groove 340 includes a heart-shaped part 341 and a linear part 342 on the front side, as illustrated in FIG. 3A. It is to be noted that the bottom plane of the second cam groove 440 (the plane visible by the top view) may have an inclination, a level difference, or the like formed thereon to inhibit the movement of the first cam pin 330 in the directions reverse to the directions described below (R1 to R5).

The heart-shaped part 341 includes a first lock side locus 3411 and a first unlock side locus 3412. The linear part 342 defines the position (home position Ph) of the other end 332 of the first cam pin 330 when the SIM tray 21 is in a state in which the SIM tray 21 is removable from the body 10.

The first lock side locus 3411 is a locus directed from a heart shape lower end position P0 to a first lock position P2 corresponding to the recessed part of the heart shape. The first lock side locus 3411 functions in the insertion process of the SD memory card 5 (and the SIM tray 21, accordingly) into the both-locked state, as illustrated in FIGS. 4 and 5.

Specifically, when the SD memory card 5 is started to be pressed to the deep side by the user from a pre-insertion state (removal completion state) illustrated in FIG. 9, a state in which the second slide member 410 abuts the slide abutting part 314 (see FIG. 4) is obtained. When the SD memory card 5 is further pressed to the deep side by the user in a state in which the second slide member 410 abuts the slide abutting part 314, the first slide member 310 and the second slide member 410 are integrally displaced to the deep side. At this time, the other end 332 of the first cam pin 330 reaches the deep side of the first lock side locus 3411 via the position P0 from the home position Ph (see R1 and R2 in FIG. 3A). Thereafter, when the SD memory card 5 (and the SIM tray 21, accordingly) is pressed to the deep side and goes over a level difference 3430 on the first lock side locus 3411, the other end 332 of the first cam pin 330 reaches a position P1 on which turning to the first lock position P2 is possible. The position P1 corresponds to the maximum pressing position of the SD memory card 5 in the insertion process. When the user stops pressing the SD memory card 5 on the position P1 on which turning is possible, the other end 332 of the first cam pin 330 turns on the position P1 to reach the first lock position P2 (see the arrow R3). That is to say, the first slide member 310 is slightly displaced to the front side with the action of the first elastic member 320, whereby the other end 332 of the first cam pin 330 reaches the first lock position P2.

The first unlock side locus 3412 is a locus leaving from the first lock position P2, and specifically, a locus directed from the first lock position P2 to the heart shape lower end position P0. In the first embodiment, as an example, the first unlock side locus 3412 is formed unsymmetrically with the first lock side locus 3411. Specifically, a length L1 in the Y direction from the first lock position P2 to a turning position P3 (an example of a first turning position) is longer than the length in the Y direction from the first lock position P2 to the maximum pressing position P1 on the first lock side locus 3411. However, in a variation, the length in the Y direction from the first lock position P2 to the maximum pressing position P1 on the first lock side locus 3411 may be equal to or longer than the length L1.

The first unlock side locus 3412 functions only in the removal process of the SD memory card 5 and the SIM tray 21, out of the removal process of the SD memory card 5 from the both-locked state illustrated in FIG. 5 to a removable state and the removal process of the SD memory card 5 and the SIM tray 21.

Specifically, when the SD memory card 5 is pressed to the deep side by the user from the both-locked state illustrated in FIG. 5, the amount of displacement to the deep side exceeds a distance L0 in the Y direction between the second slide member 410 and the first slide member 310 in the both-locked state (see FIG. 5). With this, a state in which the second slide member 410 abuts the slide abutting part 314 of the first slide member 310 is obtained. When the SD memory card 5 is further pressed to the deep side by the user in a state in which the second slide member 410 abuts the slide abutting part 314, the first slide member 310 and the second slide member 410 are integrally displaced to the deep side, as illustrated in FIG. 8. Thereafter, when the amount of displacement of the first slide member 310 exceeds the length L1 in the Y direction from the both-locked state illustrated in FIG. 5, the other end 332 of the first cam pin 330 reaches the position P3 on which turning to the lower end position P0 is possible (see the arrow R4). The position P3 corresponds to the position on which the SIM tray 21 in the removal process is removable. When the user stops pressing the SD memory card 5 on the position P1 on which turning is possible, the other end 332 of the first cam pin 330 turns on the position P3 to reach the lower end position P0 and the home position Ph (see the arrow R5). With this, as illustrated in FIG. 9, the SD memory card 5 and the SIM tray 21 become removable. In the state illustrated in FIG. 9, the SD memory card 5 and the SIM tray 21 are exposed from the body 10 on the front side, so that the user is able to remove both of the memory card 5 and the SIM tray 21 easily.

The second locus defined by the second cam groove 440 includes a heart-shaped part 441, a linear part 442 on the front side, a lock side extra length locus 443, and an unlock side extra length locus 444, as illustrated in FIG. 3B. It is to be noted that the bottom plane of the second cam groove 440 (the plane visible by the top view) may have an inclination, a level difference, a recess, or the like formed thereon to inhibit the movement of the second cam pin 430 in the directions reverse to the directions described below (R11 to R16).

The heart-shaped part 441 includes a second lock side locus 4411 and a second unlock side locus 4412. The linear part 442 defines the position of the other end 432 of the second cam pin 430 in a state in which the SD memory card 5 becomes removable from the body 10 (a home position Ph2).

The second lock side locus 4411 is a locus directed from a heart shape lower end position P10 to a second lock position P12 corresponding to the recessed part of the heart shape.

The second unlock side locus 4412 is a locus leaving from the second lock position P12, and specifically, a locus directed from the second lock position P12 to the heart shape lower end position P10. In the first embodiment, on the second unlock side locus 4412, the length L2 (an example of a second displacement amount) in the Y direction from the second lock position P12 to a turning position P13 (an example of a second turning position) is defined so as to have the following relation in order to implement the simultaneous removal/SD single removal function.

In the first embodiment, as illustrated in FIG. 5, in the both-locked state, the first slide member 310 and the second slide member 410 are apart by the distance L0 in the Y direction. With this, moving the SD memory card 5 (and the second slide member 410, accordingly) to the deep side from the both-locked state by the distance L0+L1 (an example of a first displacement amount) in the Y direction enables the other end 332 of the first cam pin 330 to reach the position P3 in FIG. 3A.

The length L2 is set such that the other end 432 of the second cam pin 430 reaches the position P13 before the other end 332 of the first cam pin 330 reaches the position P3 in FIG. 3A in the pressing process of the SD memory card 5. For example, the length L2 may be set to be equal to or smaller than the distance L0. In such a case, when or before the second slide member 410 abuts the first slide member 310 in the pressing process of the SD memory card 5, the other end 432 of the second cam pin 430 is able to reach the position P13. Alternatively, the length L2 may be set to be longer than the distance L0 but smaller than the distance L0+L1. That is to say, L0<L2<L0+L1. In such a case, even if the second slide member 410 abuts the first slide member 310 in the pressing process of the SD memory card 5, thereafter and before the other end 332 of the first cam pin 330 reaches the position P3 in FIG. 3A, the other end 432 of the second cam pin 430 is able to reach the position P13.

It is to be noted that in a variation, the distance L0 may be "0". That is to say, in the both-locked state, the first slide member 310 and the second slide member 410 abuts each other in the Y direction. In such a case, the length L2 may be set to be smaller than the distance L1 (another example of the first displacement amount).

The lock side extra length locus 443 is connected to the apex of the heart shape on the second lock side locus 4411 and extends to the side leaving from the second lock position P12 in the Y direction.

The second lock side locus 4411 and the lock side extra length locus 443 function in the insertion process of the SD memory card 5 (and the SIM card 4, accordingly) to the both-locked state, as illustrated in FIGS. 4 and 5.

Specifically, when the SD memory card 5 is pressed to the deep side by the user from the pre-insertion state (removal completion state) illustrated in FIG. 9, the second slide member 410 abuts the slide abutting part 314. After the abutting, when the SD memory card 5 is further pressed to the deep side by the user, the first slide member 310 and the second slide member 410 are integrally displaced to the deep side. At this time, the other end 432 of the second cam pin 430 reaches the deep side of the second lock side locus 4411 via the position P10 from the home position Ph2 (see R11 and R12 in FIG. 3B). Furthermore, at this time, the other end 432 of the second cam pin 430 goes over a level difference 4430 on the second lock side locus 4411 to reach a position P11 on which turning to the second lock position P12 is possible, and further travels on the lock side extra length locus 443 to reach a position P11A (see R12A). The position P11A corresponds to the maximum pressing position of the SD memory card 5 in the insertion process. That is to say, when the other end 332 of the first cam pin 330 reaches the position P1, the other end 432 of the second cam pin 430 reaches the position P11A (see FIG. 4). When the user stops pressing the SD memory card 5 on the position P11A that is beyond the position P11 on which turning is possible, the other end 432 of the second cam pin 430 reaches the second lock position P12 via the position P11 from the position P11A (see the arrow R13). That is to say, with the action of the second elastic member 420, the second slide member 410 is displaced to the front side, and the other end 432 of the second cam pin 430 reaches the second lock position P12 (see FIG. 5).

The unlock side extra length locus 444 is connected to the apex of the heart shape on the second unlock side locus 4412, and extends to the side leaving from the second lock position P12 in the Y direction. A length L3 of the second unlock side locus 4412 in the Y direction is set so as to be able to implement the simultaneous removal function. Specifically, the length L3 is equal to or longer than the value obtained by subtracting the length L2 from the distance L0+L1. That is to say, $L3 \geq L0+L1-L2$. The length L3 is defined as the distance from the position P13 to an upper end position P14 of the second unlock side locus 4412, for example. The unlock side extra length locus 444 enables to press the first slide member 310 to the deep side (pressing for causing the other end 332 of the first cam pin 330 to reach the position P3), as described later.

The second unlock side locus 4412 and the unlock side extra length locus 444 function in both of the single removal process of the SD memory card 5 from the both-locked state illustrated in FIG. 5 to the removable state and the simultaneous removal process of the SD memory card 5 and the SIM tray 21.

The function in the single removal process of the SD memory card 5 is described below. When the SD memory card 5 is started to be pressed to the deep side by the user from the both-locked state illustrated in FIG. 5, the second slide member 410 is displaced to the deep side as illustrated in FIG. 6. It is to be noted that at this time, the second slide member 410 does not abut on the slide abutting part 314, and the second slide member 410 is displaced to the deep side alone. Thereafter, when the amount of displacement of the second slide member 410 in the Y direction from the both-locked state illustrated in FIG. 5 exceeds the length L2 (see FIG. 3B), the other end 432 of the second cam pin 430 reaches the position P13 on which turning to the lower end position P10 is possible (see the arrow R14). The position P13 corresponds to the position on which only the SD memory card 5 is removable in the removal process. When the user stops pressing the SD memory card 5 on the position P11 on which turning is possible, the other end 332 of the first cam pin 330 turns on the position P13 to reach the lower end position P10 and the home position P1h (see the arrow R15). With this, as illustrated in FIG. 7, a state in which only the SD memory card 5 is removable (removal completion state of the SD memory card 5) is obtained. In the state illustrated in FIG. 7, the SD memory card 5 is exposed from the body 10 on the front side, so that the user is able to remove the SD memory card 5 easily. It is to be noted that in the state illustrated in FIG. 7, the lock state of the SIM tray 21 is maintained.

The function in the simultaneous removal process of the SD memory card 5 and the SIM tray 21 is described below. When the SD memory card 5 is started to be pressed to the deep side by the user from the both-locked state illustrated in FIG. 5, the second slide member 410 is displaced to the deep side as illustrated in FIG. 6. When the second slide member 410 is further displaced to the deep side, the other end 432 of the second cam pin 430 travels on the unlock side extra length locus 444 to move to the upper side from the position P13 (see the arrow R16). Thereafter, when the amount of displacement of the second slide member 410 in the Y direction after passing the length L2 exceeds the length L3, the other end 432 of the second cam pin 430 reaches the position P14 (see the arrow R16). When the other end 432 of the second cam pin 430 reaches the position P14, the other end 332 of the first cam pin 330 reaches the position P3 (FIG. 3A). When the user stops pressing the SD memory card 5 on the position P14, the other end 432 of the second cam pin 430 reaches the lower end position P10 and the home position Ph2 via the position P13 (see the arrow R17). At the same time, as described above, the other end 332 of the first cam pin 330 turns on the position P3 to reach the lower end position P1 and the home position Ph (see the arrow R5 in FIG. 3A). With this, as illustrated in FIG. 9, a state in which the SD memory card 5 and the SIM tray 21 are removable (removal completion state of the SD memory card 5 and the SIM tray 21) is obtained.

Accordingly, the user is able to remove only the SD memory card 5 by pressing the SD memory card 5 to the deep side by the distance corresponding to the length L2 in the both-locked state. Furthermore, the user is able to remove both of the SD memory card 5 and the SIM tray 21 by pressing the SD memory card 5 to the deep side by the distance L0+L1 in the both-locked state.

As described above, in the first embodiment, the second heart-cam mechanism enables to remove the SD memory card 5 in a manner in which removal of the SD memory card 5 is not accompanied by removal of the SIM tray 21 in the both-locked state. Furthermore, the first heart-cam mechanism and the second heart-cam mechanism are formed so as to interlock with the displacement of the SD memory card 5 to the deep side and cooperate with each other to enable simultaneous removal of the SD memory card 5 and the SIM tray 21 in the both-locked state.

Furthermore, in the first embodiment, the lock side extra length locus 443 is included, and thus, as described above, the user is able to press the SIM tray 21 via the SD memory card 5 by pressing the SD memory card 5 to the deep side from the pre-insertion state (removal completion state) illustrated in FIG. 9. However, in the first embodiment, the user is also able to implement the both-locked state by inserting the SIM tray 21 into the body 10 to obtain the lock state thereof, and after that, inserting the SD memory card 5 into the body 10 to obtain the lock state thereof.

Figure 10:
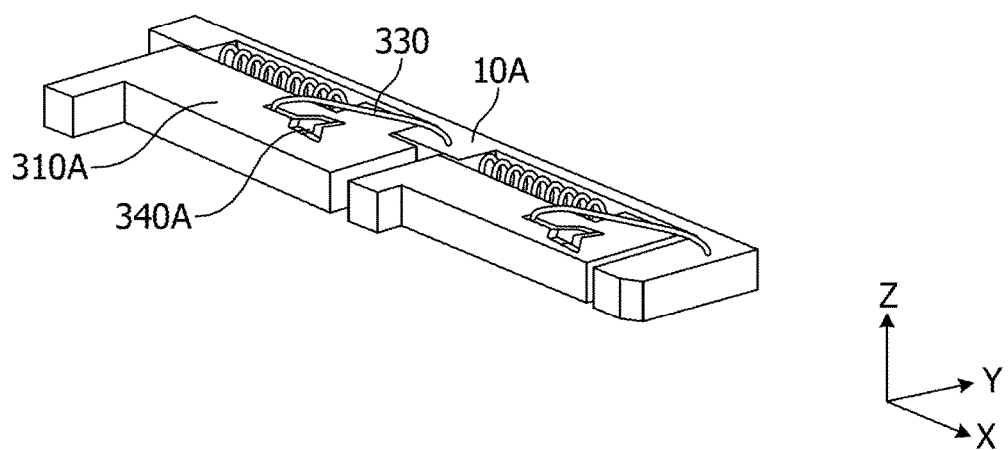
FIG. 10 is a diagram illustrating a variation in which a cam groove is formed on a slide member side.

It is to be noted that in the first embodiment, although the first cam groove 340 is provided on the body 10 and the rotation supporting point (the one end 331) of the first cam pin 330 is provided on the first slide member 310, the embodiment is not limited thereto. That is to say, as in the variation illustrated in FIG. 10, a first cam groove 340A corresponding to the first cam groove 340 may be provided on a first slide member 310A, and the rotation supporting point (the one end 331) of the first cam pin 330 may be provided on the body 10A. The same is true with the second cam pin 430 and the second cam groove 440 as in the variation illustrated in FIG. 10. It is to be noted that in FIG. 10, only a part of the body 10A (a part related with the mechanism) is illustrated.

Figure 11:
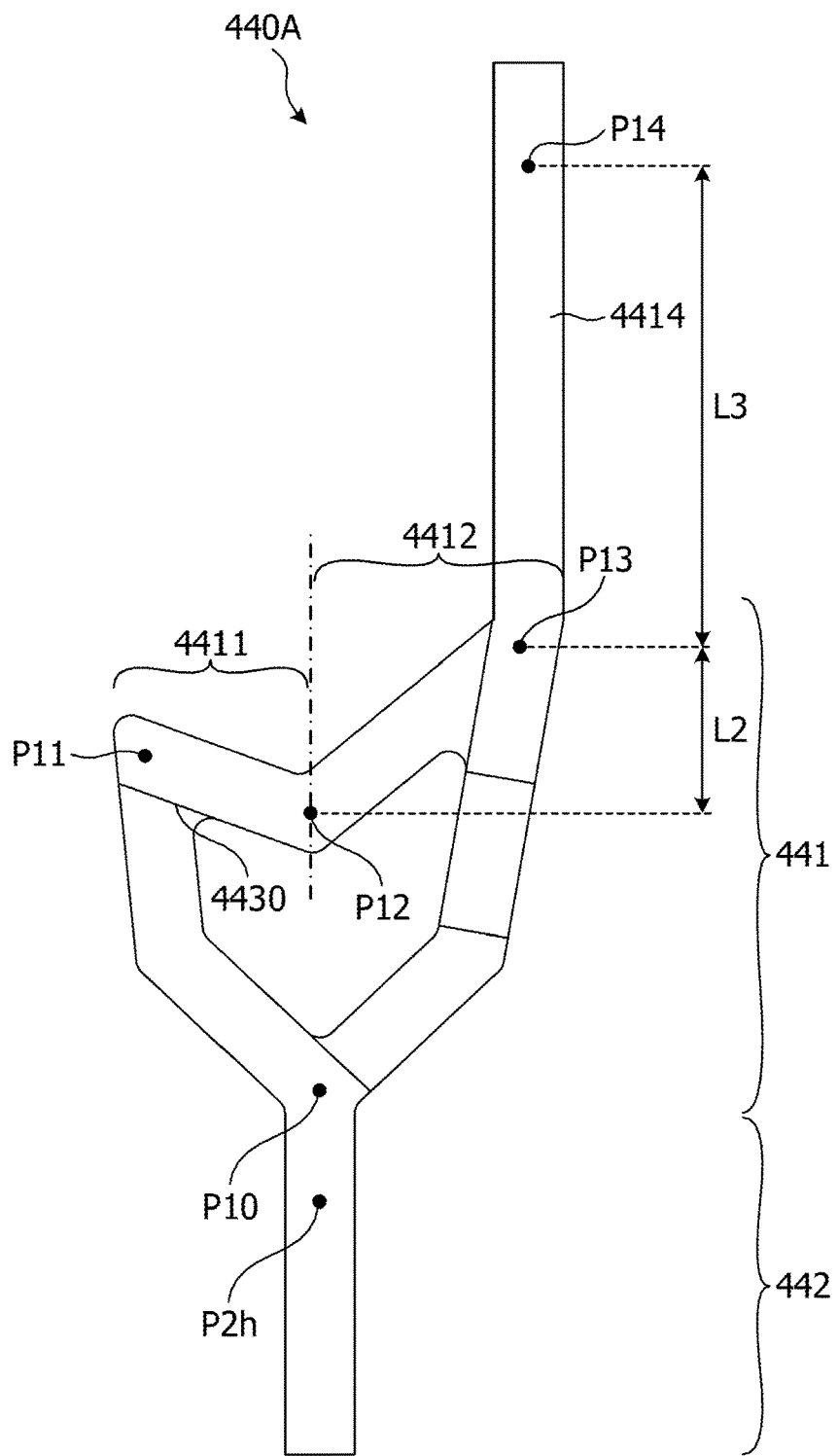
FIG. 11 is a diagram illustrating a variation of the second cam groove (an example in which an extra length locus on a lock side is not present)

Furthermore, in the first embodiment, although the first locus formed by the second cam groove 440 has the lock side extra length locus 443, the embodiment is not limited thereto. Similarly to the second cam groove 440A in the variation illustrated in FIG. 11, the lock side extra length locus 443 may be omitted. In such a case, the insertion of the SD memory card 5 for moving to the lock state and the insertion of the SIM tray 21 for moving to the lock state are separately implemented. That is to say, after the SIM tray 21 is inserted into the body 10 to obtain the lock state thereof, inserting the SD memory card 5 into the body 10 to obtain the lock state thereof implements the both-locked state.

Furthermore, in the first embodiment, although the SD memory card 5 is not held on the tray but directly inserted into and removed from the body 10, the embodiment is not limited thereto. The SD memory card 5 may be insertable into and removable from the body 10 in a state held on a tray other than the SIM tray 21 (an example of a second tray). In such a case, the other tray is formed so as to abut the card locking part 411 of the second slide member 410 in the Y direction. It is to be noted that in such a case, in the other tray, a holding part, on which either the SD memory card 5 or a second SIM card is able to be selectively held, may be set.

Second Embodiment

In the description of a second embodiment described below, a component that may be the same as one in the above-described first embodiment will be denoted with the same reference numeral and the description thereof will be omitted in some cases.

Figure 12:
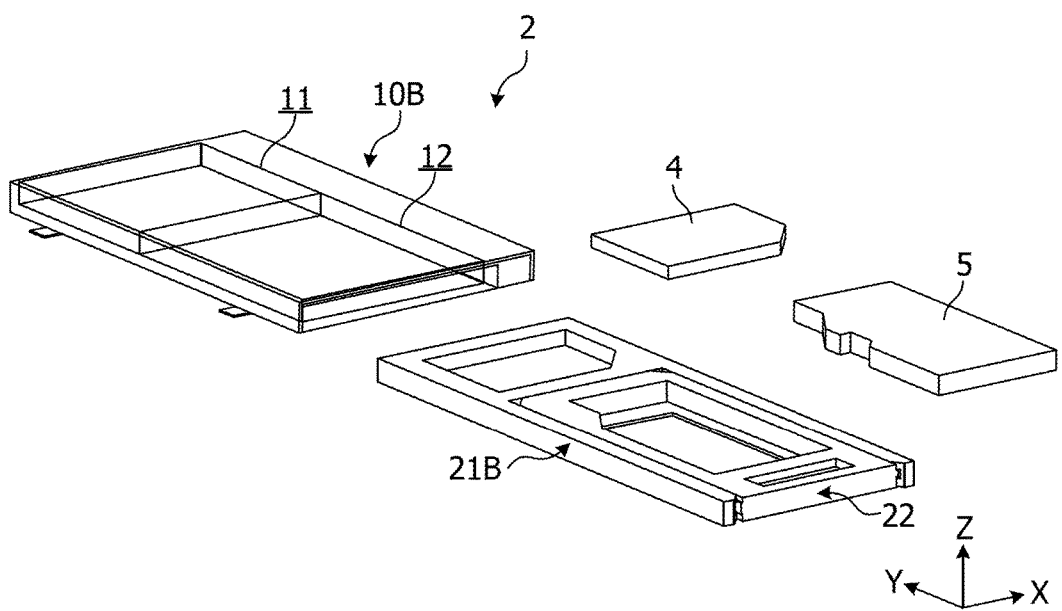
FIG. 12 is a diagram illustrating a connector device according to a second embodiment.
Figure 13:
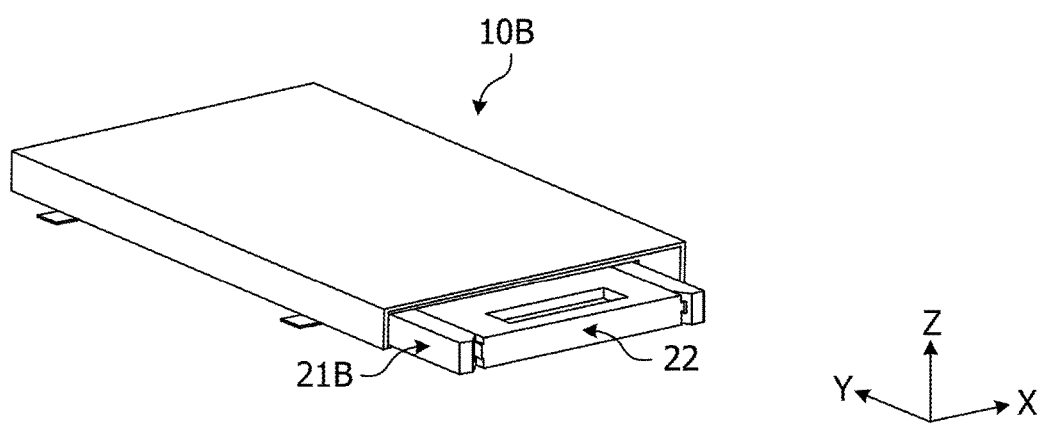
FIG. 13 is a diagram illustrating the connector device according to the second embodiment.
Figure 14:
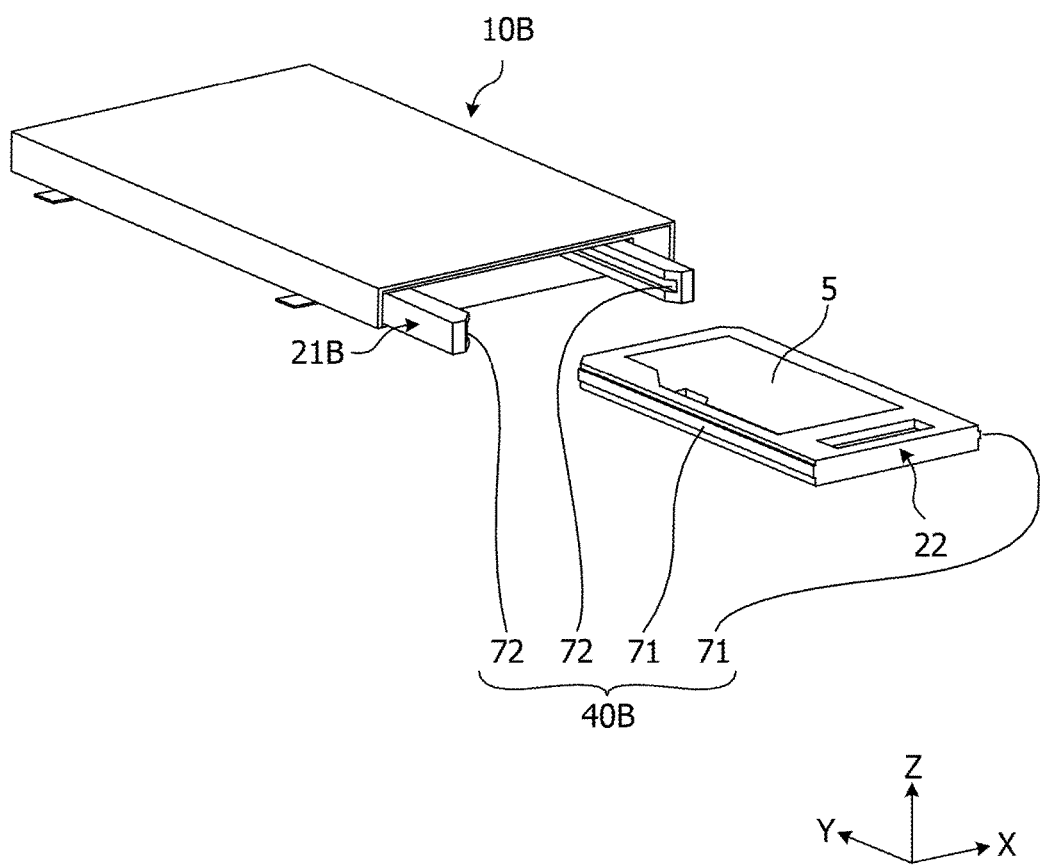
FIG. 14 is a diagram illustrating the connector device according to the second embodiment.

FIGS. 12 to 14 are diagrams illustrating a connector device 2 according to the second embodiment. FIG. 12 illustrates a state in which the connector device 2 is disassembled only partly. FIG. 13 illustrates a state in which both the SIM card 4 and the SD memory card 5 are inserted. FIG. 14 illustrates a state in which the SIM card 4 has been removed.

The connector device 2 includes a body 10B, a SIM tray 21B, an SD tray 22 (an example of the second tray), a first mechanism (not illustrated), and a second mechanism 40B.

The body 10B is different from the body 10 according to the above-described first embodiment in that the second cam groove 440 is not formed on the body 10B. On the body 10B, a cam groove (not illustrated) of the first mechanism (heart-cam mechanism) is formed. Although the cam groove of the first mechanism may be the same as the first cam groove 340 illustrated in FIG. 3A, the first lock side locus 3411 and the first unlock side locus 3412 may be symmetrical. With the first mechanism, the SIM tray 21B is insertable and removable in the Y direction with respect to the first space 11 of the body 10B.

The SIM tray 21B is different from the SIM tray 21 according to the above-described first embodiment in that the SIM tray 21B substantially includes guide grooves 72 (see FIG. 14). The guide grooves 72 each have a function to guide the insertion and removal operations of the SD tray 22 and forms the second mechanism 40B.

The SD tray 22 is a tray capable of holding the SD memory card 5. It is to be noted that in the SD tray 22, a holding part, on which either the SD memory card 5 or the second SIM card is able to be selectively held, may be set. On the both sides of the SD tray 22 in the X direction, guide projections 71 are formed.

The second mechanism 40B is formed by the guide projections 71 of the SD tray 22 and the guide grooves 72 of the SIM tray 21B. The guide projections 71 fit into the guide grooves 72 of the SIM tray 21B and are slidable in the Y direction. With this, the SD tray 22 becomes insertable into and removable from the SIM tray 21B in the Y direction. That is to say, with the second mechanism 40B, the SD tray 22 is insertable and removable in the Y direction with respect to the second space 12 of the body 10B.

The user is able to move the SIM tray 21B to the lock state, as illustrated in FIG. 14, by pressing the SIM tray 21B into the body 10B in a state in which the SIM card 4 is held on the SIM tray 21B. Next, the user presses the SD tray 22, on which the SD memory card 5 is held, into the SIM tray 21B while sliding the SD tray 22 in a manner in which the guide projections 71 travel through the guide grooves 72 of the SIM tray 21B. With this, the user is able to move the SD tray 22 to an insertion state, as illustrated in FIG. 13.

According to the second embodiment also, as in the above-described first embodiment, out of the first space 11 and the second space 12 which are arranged in line with each other in the Y direction, with respect to the first space 11, the SIM tray 21 is insertable and removable with the first mechanism, and with respect to the second space 12, the SD memory card 5 is insertable and removable with the second mechanism 40B. At this time, the user is able to remove only the SD memory card 5 and thereby able to avoid an inconvenience caused by insertion and removal of the SIM tray that possibly occurs accompanied by insertion and removal of the SD memory card (inconvenience by which the power supply of the communication terminal has to be turned off). Furthermore, using the first space 11 and the second space 12 which are arranged in line with each other in the Y direction enables to enhance thinning of the connector device 2 in the thickness direction (up and down direction).

Although the details of each embodiment have been described above, the embodiment is not limited to a specific embodiment, and various modifications and alterations may be made within the scope described in the claims. Furthermore, all or a plurality of components in the embodiments described above may be combined.

For example, in the embodiments described above, although two media (the SIM card 4 and the SD memory card 5) are insertable and removable, a mechanism may be added to cause three or more media to be insertable and removable.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A connector device comprising:
    a body having an opening on one end in a first direction, the body including inside
        a first space, and
        a second space positioned closer to the opening than the first space in the first direction and arranged in line with the first space in the first direction;
    a first tray that holds a first medium;
    a first sliding assembly that inserts and removes the first tray in the first direction with respect to the first space via the opening; and
    a second sliding assembly that inserts and removes a second medium different from the first medium in the first direction with respect to the second space via the opening, wherein
    out of the first tray and the second medium, only the second medium is removed in a state in which the first tray and the second medium are inserted into the body.

2. The connector device according to claim 1, wherein the first sliding assembly includes
    a first slide member displaceable with respect to the body in the first direction,
    a first elastic member that biases the first slide member in the removal direction of the first tray in the first direction, and
    a first heart-cam assembly that defines movement of the first tray
    in the first direction, and
    the second sliding assembly includes
        a second slide member displaceable with respect to the body,
        a second elastic member that biases the second slide member in the removal direction of the second medium in the first direction, and
    a second heart-cam assembly that defines movement of the second medium in the first direction.

3. The connector device according to claim 2, wherein the first heart-cam assembly and the second heart-cam assembly are formed so as to interlock with displacement to the insertion direction of the second medium in the first direction in a state in which the first tray and the second medium are inserted into the body.

4. The connector device according to claim 3, wherein the second heart-cam assembly interlocks with the displacement by a second displacement amount to move the second medium to a removal state from the body, and
the first heart-cam assembly interlocks with the displacement by a first displacement amount higher than the second displacement amount to move the first tray to a removal state from the body.

5. The connector device according to claim 4, wherein the first heart-cam assembly includes a first cam pin having one end supported by one of the first slide member and the body and a first cam groove that is positioned on the other one of the first slide member and the body and defines a first locus traveled by the other end of the first cam pin, the other end of the first cam pin fitting into the first cam groove, the second heart-cam assembly includes a second cam pin having one end supported by one of the second slide member and the body and a second cam groove that is positioned on the other one of the second slide member and the body and defines a second locus traveled by the other end of the second cam pin, the other end of the second cam pin fitting into the second cam groove, a heart-shaped part of the first locus includes a first unlock side locus that is directed to a first lower end position on the lower side of the heart shape from a first lock position corresponding to a recessed part of the heart shape and has a first turning position enabling turning to the first lower end position on an apex of the heart shape, a heart-shaped part of the second locus includes a second unlock side locus that is directed to a second lower end position on the lower side of the heart shape from a second lock position corresponding to a recessed part of the heart shape and has a second turning position enabling turning to the second lower end position on an apex of the heart shape, the second locus includes an unlock side extra length locus that is connected to the apex of the heart shape and extends to a side leaving from the second lock position in the first direction, the first displacement amount corresponds to a sum of a distance from the first lock position to the first turning position in the first direction and a distance between the first slide member and the second slide member in the first direction in a state in which the first tray and the second medium are inserted into the body, the second displacement amount corresponds to a distance from the second lock position to the second turning position in the first direction, and a length of the first direction on the unlock side extra length locus is equal to or longer than a value obtained by subtracting the second displacement amount from the first displacement amount.

6. The connector device according to claim 5, wherein the heart-shaped part of the second locus further includes a second lock side locus that is directed from the second lower end position to the second lock position, and the second locus further includes a lock side extra length locus that is connected to the apex of the heart shape of the second lock side locus and extends to the side leaving from the second lock position in the first direction.

7. The connector device according to claim 1, further comprising:

a second tray capable of holding the second medium, wherein, with the second sliding assembly, the second tray is insertable and removable with respect to the second space in the first direction, and the second medium is insertable and removable with respect to the second space.

8. The connector device according to claim 1, further comprising:

a second tray capable of holding the second medium, wherein, with the second sliding assembly, the second tray is slidable in the first direction with respect to the first tray, and the second medium is insertable and removable with respect to the second space.

9. The connector device according to claim 1, wherein the first medium is a SIM card and the second medium is a memory card.

* * * * *